United States Patent [19]

Luther et al.

[11] 4,245,940
[45] Jan. 20, 1981

[54] METHOD AND APPARATUS FOR SORTING AND STACKING CONDUCTOR PLATES TESTED IN A CONDUCTOR PLATE TESTER AND AN APPARATUS FOR CARRYING OUT THE SAME

[75] Inventors: Erich Luther, Ronnenberg; Martin Maelzer, Wunstorf, both of Fed. Rep. of Germany

[73] Assignee: Luther & Maelzer GmbH, Wunstorf, Fed. Rep. of Germany

[21] Appl. No.: 970,248

[22] Filed: Dec. 18, 1978

[30] Foreign Application Priority Data

Apr. 6, 1978 [DE] Fed. Rep. of Germany ....... 2814955

[51] Int. Cl.³ .............................................. B65G 57/30
[52] U.S. Cl. ..................................... 414/95; 209/698; 271/212; 271/303; 414/32
[58] Field of Search ................. 209/629, 698; 271/212, 271/223, 302, 303, 305, 262, 263; 73/159; 93/93 K

[56] References Cited

U.S. PATENT DOCUMENTS

| 2,224,606 | 12/1940 | Neckel | 271/212 |
| 2,361,960 | 11/1944 | Pelosi | 414/96 X |
| 3,122,229 | 2/1964 | Engleson et al. | 414/96 X |
| 3,480,140 | 11/1969 | Unkefer | 209/698 X |
| 3,662,901 | 5/1972 | Brintley | 271/223 X |
| 4,068,767 | 1/1978 | Tippetts | 414/32 |

FOREIGN PATENT DOCUMENTS 105974 11/1966 Denmark ................................. 414/95

*Primary Examiner*—Leslie J. Paperner
*Attorney, Agent, or Firm*—Owen, Wickersham & Erickson

[57] ABSTRACT

Sorting and stacking tested conductor plates by forming from the bottom up a stack of conductor plates which have passed the tests, raising from the bottom the entire stack each time a tested conductor plate approaches the bottom of the stack, feeding each tested conductor plate beneath the raised stack to temporary support means, actuating the temporary support means to eject a failed said plate, lowering the stack after an ejection opportunity has passed, whether used or not, and lowering the lifting means below the latest tested plate that has passed the test, so that such a plate is incorporated into the stack before the lifting means is next activated.

3 Claims, 6 Drawing Figures

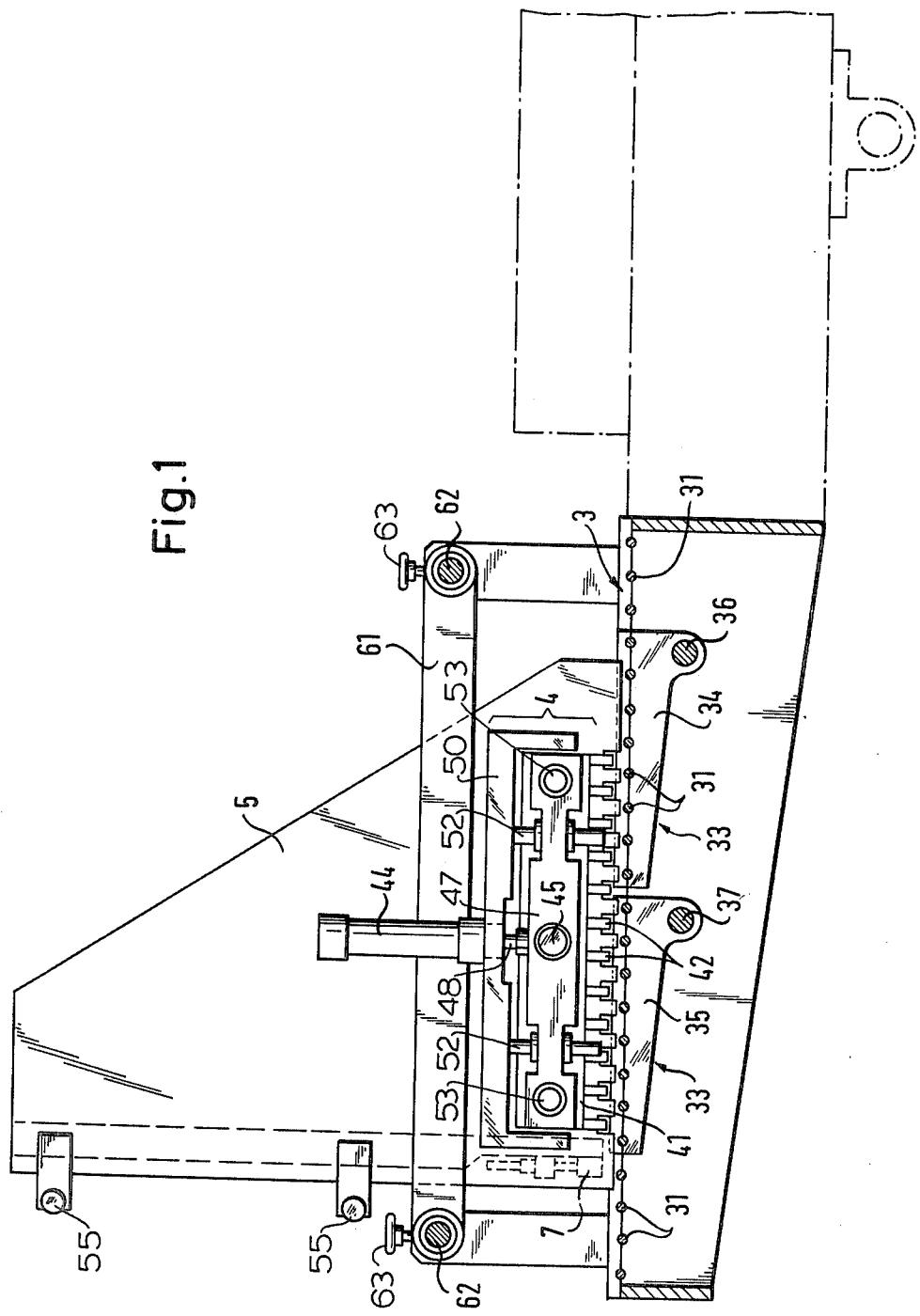

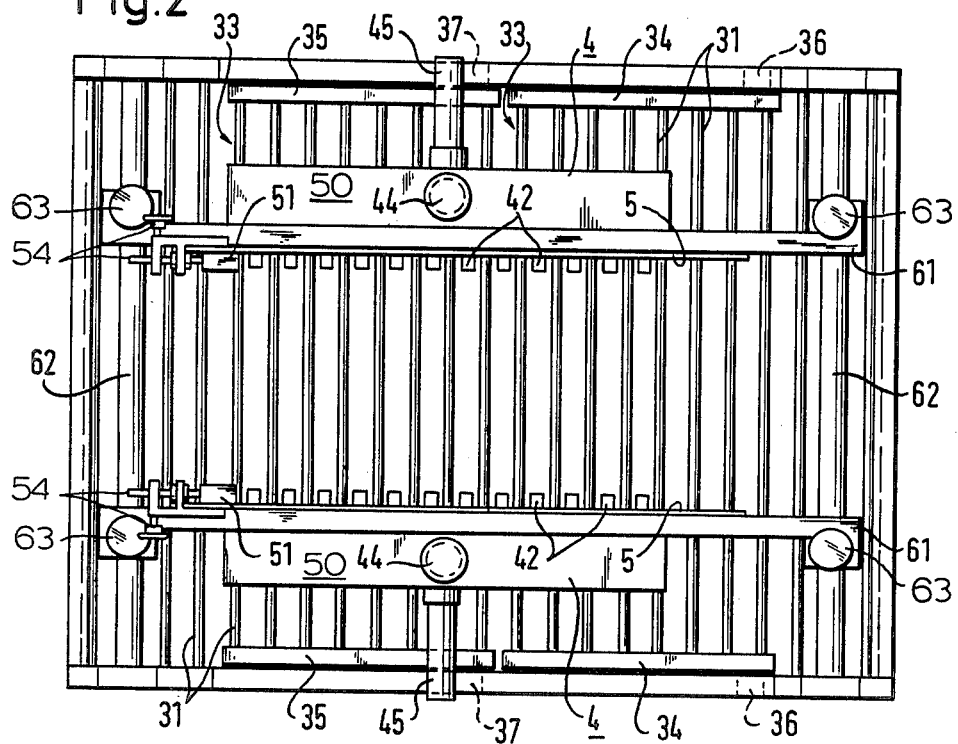
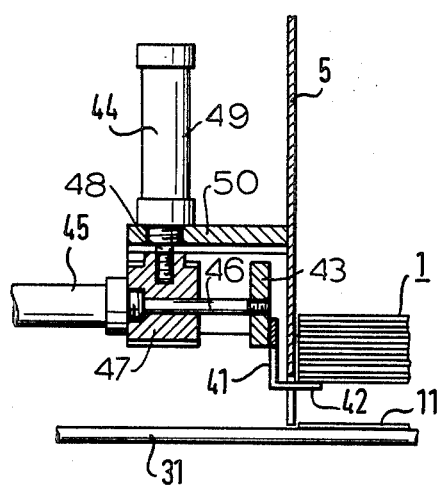
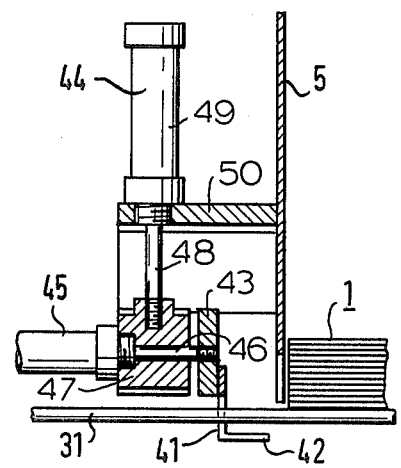

METHOD AND APPARATUS FOR SORTING AND STACKING CONDUCTOR PLATES TESTED IN A CONDUCTOR PLATE TESTER AND AN APPARATUS FOR CARRYING OUT THE SAME

BACKGROUND OF THE INVENTION

The invention relates to a method and apparatus for sorting and stacking conductor plates tested in a conductor plate tester.

In the manufacture of electronic circuits, components are often inserted into conductor plates and soldered there, so that a finished electronic circuit is obtained. The conductor plate used for this purpose must be tested for faults, for example, for interruptions of the conductor paths and for faulty insulation between the individual conductor paths, as well as for an offset between the contact holes and contact eyes, and the faulty conductor plates must be sorted out. For this purpose, conductor plate testers are used in which conductor plates are fed from a stockpile into the tester proper, are examined there, and then sorted in accordance with the faults determined there.

With one known conductor plate tester, the tested faultless conductor plates are sent into a magazine so that the first-tested conductor plates have the following conductor plates piled up on top of them. When such a magazine is filled, the testing process of the machine must be interrupted in order to insert a new magazine. Such as interruption causes delays and is therefore undesirable.

In another known conductor plate tester, the tested conductor plates are thrown successively into containers in which they then lie without order on top of each other. The conductor plates must subsequently be placed in order and aligned in an additional operational step which also requires the expenditure of time and additional apparatus.

It is an object of the invention to sort and stack tested conductor plates from a conductor plate tester in such a way that the tested conductor plates can be continuously stacked and removed, and also so that the testing process need not be interrupted for a magazine exchange, while at the same time no additional operational step is needed for aligning the conductor plates or placing them in order.

SUMMARY OF THE INVENTION

In accordance with the invention, the tested conductor plates are stacked so that the last-tested conductor plate is fed from below to a stack of already tested conductor plates. For this purpose, the stack is raised by a gripping device, the last-tested conductor plate is guided underneath this stack, the stack is then again lowered, so that it lies on top of the last-tested conductor plate, and then the stack which has been augmented by this conductor plate is again raised, so that the next-tested conductor plate can again be added to the stack from below.

An advantage of this system for stacking the tested conductor plates in accordance with the invention is that it becomes possible to remove tested conductor plates from the pile from above as often as desired, without any need of interrupting the flow of work of the tester. Moreover, since the stacked and removable conductor plates have already been aligned, they are ready for packaging.

With a stacking device of this invention, a flap mechanism is combined in an advantageous manner for sorting out the faulty conductor plates. This flap mechanism is disposed in the area of the transport path from which the conductor plates are guided underneath the stack of the tested conductor plates. This flap mechanism comprises one or several individual flaps which are opened, under the control of the tester, when a conductor plate must be eliminated, for example due to faulty insulation. Another possibility for eliminating a faulty conductor plate in accordance with the invention, passes a conductor plate which has been determined as being faulty underneath the raised stack of the faultless conductor plates, but the faulty plate is not gripped by the gripper device so that it is not added to the stack. For this purpose, the transport paths on which the conductor plate advances to the stack, may be inclined. The possibility of a conductor plate slipping through underneath the raised stack of the faultless conductor plates has the advantage that, in the event of trouble in the machinery, it is in any case insured that the conductor plates are not added to the stack of faultless conductor plates, but are slipped through underneath the stack.

The invention is described and explained in further detail hereinbelow in connection with an embodiment, the method in accordance with the invention as well as the apparatus suitable for carrying out the same being discussed jointly.

BRIEF DESCRIPTION OF THE DRAWINGS

In the drawings:

FIG. 1 is a side view in elevation of an apparatus embodying the principles of the invention for sorting and stacking tested conductor plates.

FIG. 2 is a top plan view of the apparatus of FIG. 1.

FIG. 3 is a fragmentary somewhat schematic view in vertical section of a stack of tested conductor plates being raised.

FIG. 4 is a similar view with the stack lowered and ready to receive a new plate at the bottom.

DESCRIPTION OF A PREFERRED EMBODIMENT

Figure 6:
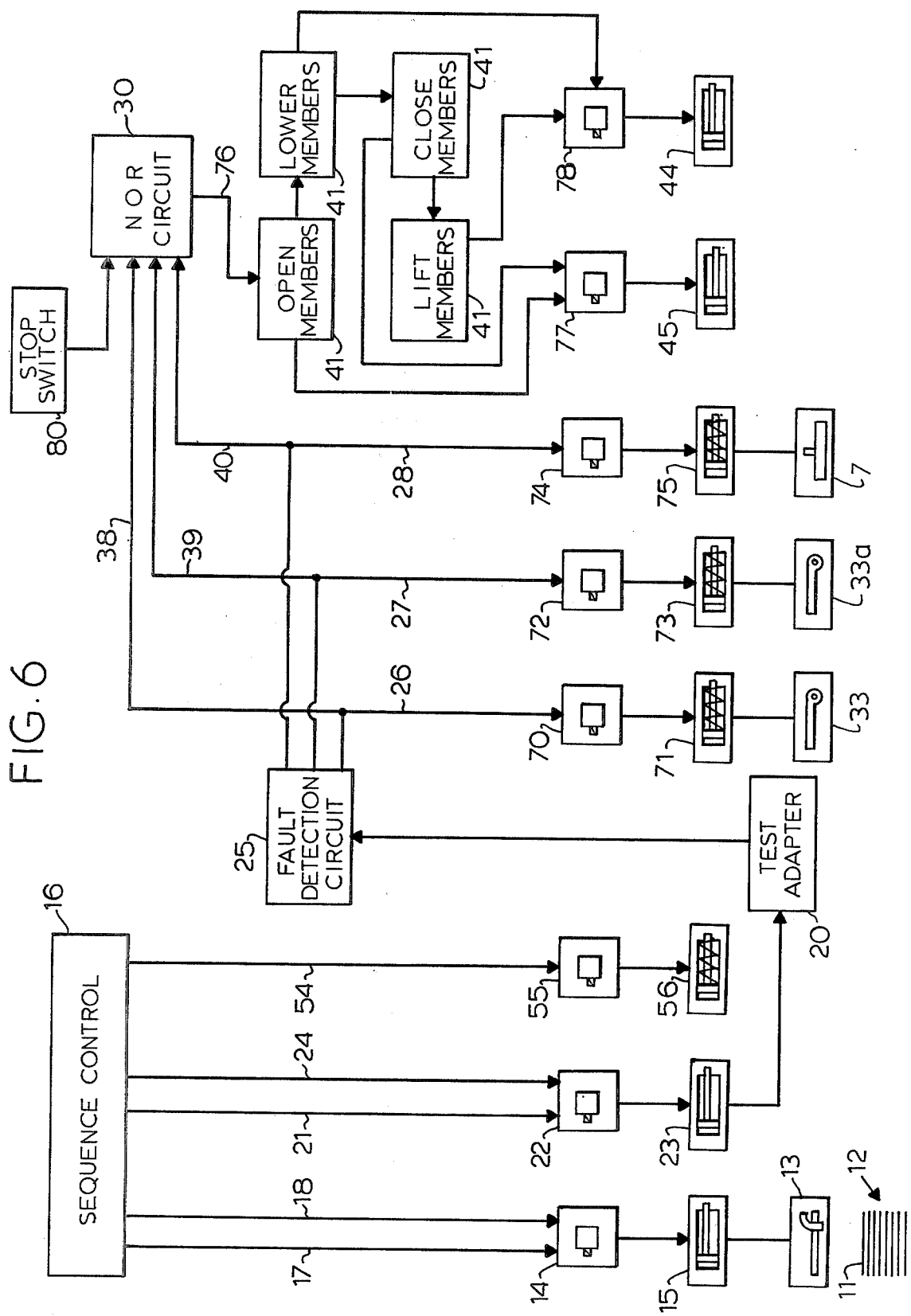
FIG. 6 is a diagrammatic representation of apparatus, showing its sequence control and various functions, of a particular system embodying the present invention.

Individual conductor plates 11 are ejected from a stockpile 12 with the aid of a slide 13 which is described in copending application Ser. No. 970,484, filed Dec. 18, 1978, and which is provided with reference number 3 in that application. As shown in FIG. 6 herein, the slide 13 is actuated by a solenoid valve 14 which controls a pneumatic cylinder-piston device 15 to which the slide 13 is fixed, and the pneumatic cylinder 15 is actuated by a corresponding signal of a sequence control 16. When the sequence control 16 sends a signal to the solenoid 14 via a "slide advance" line 17, a conductor plate 11 is ejected from the stack; then the sequence control 16 sends a signal to the solenoid valve 14 via a "slide retract" line 18, to retract the slide 13.

The ejected conductor plate 11 then advances on an inclined transport path into the tester. There, the sequence control 16 sends a signal to cause a test adapter 20 to be lowered on the arrival of the conductor plate 11 and to be put on the conductor plate 11 to be tested. The signal may, for example, go via a "lower test adapter" line 21 to a solenoid valve 22 that actuates a pneumatic cylinder-piston device 23 to lower the test adapter 20.

A test fault-detector circuit 25 is connected to the test adapter 20 for testing the individual conductor plates 11 as to faults. For example, if the plate 11 has faulty insulation, the circuit 25 emits a pulse signal to a "faulty insulation" line 26. If the plate 11 has the defect of interrupted conductor paths, an "interrupted conductor path" pulse signal is sent via a line 27. If the plate 11 has punching offset faults, a "punching offset fault" pulse signal is sent from the current 25 via a line 28. As seen below, any such fault will cause ejection of the plate 11.

If these faults are not found, a NOR circuit 30 is actuated by the circuit 25 via respective lines 38, 39, and 40, one for each fault test asked for. After successful conclusion of the test process, the test adapter 20 is lifted off the conductor plate 11 which has passed the tests, by a signal from the sequence control 16 via a lift test adapter line 24 to the solenoid valve 22. Then, after the test adapter 20 has been raised, a signal is supplied by the sequence control 16 via an "eject tested plate" line 54 to a further solenoid valve 55, and the solenoid valve 55 is operated to actuate a further pneumatic cylinder-piston device 56 to eject the successfully tested conductor plate 11 from the tester.

Returning to the testing portion of the device, the fault-detecting pulse circuit 20 may (as shown and just described) have three outputs, a specific error being associated with each output. If, by way of example, the conductor plate 11 upon test proves to have faulty insulation, then a solenoid valve 70 receives the signal from the "faulty insulation" line 26 of the pulse circuit 25 and thereupon actuates a pneumatic cylinder-piston device 8 (See also FIG. 5); thereby a flap 33 (like the flap 31 in FIG. 1) to which this pneumatic cylinder 8 is fixed is opened. When the flap 33 is open, the conductor plate 11 having faulty insulation drops through and is sorted out as a rejected plate. This applies analogously for an interrupted conductor path. The output 27 of the pulse circuit 25 corresponding to an interrupted conductor path is likewise supplied to a solenoid valve 72, and that valve 72 actuates a pneumatic cylinder 8a to open a flap 33a. If the pulse circuit has determined a punching offset, a signal is supplied by the corresponding output 28 of the pulse circuit 25 to a further solenoid valve 74, which actuates a pneumatic cylinder 75, which in this case lifts the locking slide 7, so that the faulty conductor plate 11 passes through underneath the lifted stack 1 of faultless conductor plates and is sorted out.

If it has been determined by the pulse circuit 25 that the tested conductor plate is faulty and has to be sorted out, the stack 1 of tested conductor plates 11 should remain raised. In order to make this possible, the three outputs 38, 39, and 40 corresponding to the individual defects are applied to the inputs of the NOR circuit 30. The output 76 of this NOR circuit 30 is applied to the stacking device. If the pulse circuit 25 indicates an error, no signal is applied to the output 76 of the NOR circuit 30 so that the stacking device remains blocked. If, however, the pulsated conductor plate 11 shows an error, a signal is applied to the output 76 of the NOR circuit 30 by which the stacking device is put into operation.

Figure 5:
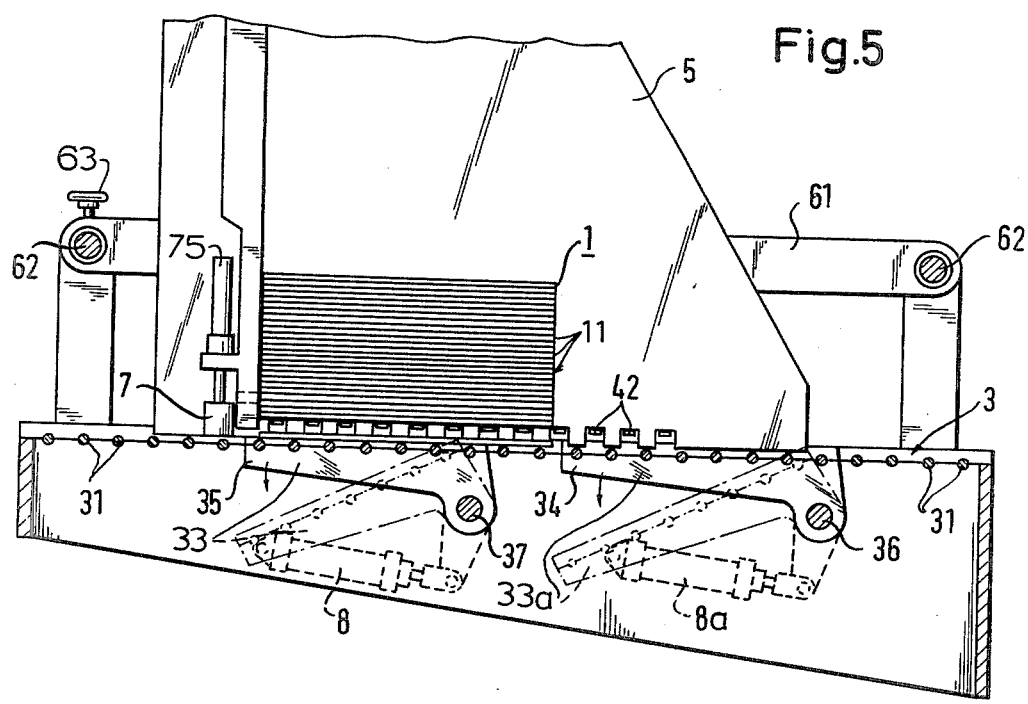
FIG. 5 is a fragmentary and somewhat schematic view in side elevation and partly in section of the sorting apparatus for sorting out faulty conductor plates; broken lines indicate ejecting positions of the flaps.

FIG. 1 is a schematic side view of an apparatus embodying the principles of the invention. After having been tested, each conductor plate 11 is moved from the right onto a temporary support 3 which is formed of individual rods 31. The rods 31 are disposed transversely to the feed direction of the conductor plates 11. Some of these rods 31 are combined with a pair of hinged arms 34 or 35 to form one or more flaps 33, 33a which may be rotated about axis 36 or 37, respectively, as shown in FIG. 5. As may be seen there, when the flap 33 (or 33a) is open, an arriving conductor plate 11 is moved down and is thereby sorted out. These flaps 33 and 33a can be selectively controlled with the pneumatic swiveling devices 8, 8a (FIG. 5), so that, depending on the fault established, a specific one of the flaps 33 or 33a is opened, and the faulty conductor plate is dropped into a container, not shown, corresponding to the established defect.

When both flaps 33 and 33a remain closed, the conductor plate 11 arrives between two side walls 5. As the conductor plate 11 arrives, a stack 1 of tested and approved conductor plates 11 is raised, as shown in FIG. 3, so that the arriving conductor plate 11 comes to lie underneath the stack 1 (FIG. 3). The conductor plate 11 is held in position by a pair of stops 51 (FIG. 2) so that it is aligned with the conductor plates 11 disposed above it. The stack 1 of conductor plates 11 is raised by two gripper devices 4 disposed opposite each other and mounted on the side walls 5.

As is illustrated in FIGS. 3 and 4, the test adapter 20 includes a single gripper device 4 comprises an angle member 41 which is secured, as by welding, to a bracket 43 located on the end of a piston rod 46 of a hydraulic or pneumatic cylinder 45 and can be moved therewith laterally in relation to the stack 1 of conductor plates 11 (to the left in FIG. 3). The cylinder 45 is secured to a block 47, with the rod 46 being slidable therein, and the block 47 is secured to the end of a piston rod 48 of an hydraulic or pneumatic cylinder 49 that forms part of an elevating mechanism 44 with which the cylinder 45 and thereby also the angle member 41 may be moved up and down, as shown in FIGS. 3 and 4. The elevating mechanism 44 includes a plate 50 secured to the side wall 5, so that the cylinder 49 remains fixed with respect to its side wall 5. Vertical guide rods 52 and horizontal guide rods 53 are also provided for retaining proper alignment of parts in the devices 44 and 45. When the angle member 41 underneath the stack 1 is removed by means of retracting the rod 46 into the cylinder 45, the stack 1 falls back onto the latest-arrived tested conductor plate 11. The angle member 41 is then lowered by means of the elevating mechanism 44 (compare FIG. 4), and after having been lowered, pushed underneath the latest-arrived conductor plate 11 by means of the cylinder 45, is then again raised by means of the elevating device 44, the entire stack 1 (augmented by the latest-arrived conductor plate 11) being thereby raised. The apparatus is thus prepared for receiving the next tested and approved conductor plate.

A lower comb-like horizontal portion of the angle member 41, which engages underneath the stack 1 comprises individual tines 42 aligned so that they extend into the spaces between the rods 31. This makes it easy to engage in a simple manner the conductor plate 11 which rests on the rods 31.

For stacking, first the angle members 41 are moved apart laterally. The tines 42 of these angle members 41 then no longer grip underneath the stack 1 of plates so that the stack 1 drops. The moving apart of the angle members 41 likewise takes place by the operation of a solenoid valve 77 which in its turn actuates the pneumatic cylinder 45. Following this, the angle members 41 are lowered. This likewise takes place by the elevating cylinder 44 being actuated with the aid of a solenoid valve 78. After the angle members 41 have been lowered, they are moved towards each other by the actuation of the pneumatic cylinder 45 and closed so that the tines 42 of these angle members 41 grip under the lowermost conductor plate of the stack 1 of plates 11. After this, the stack 1 of plates 11 is lifted again by the actuation of the elevating cylinder 44. Each time there is an incoming faultless conductor plate 11, this cycle is repeated.

In the stacking of the conductor plates, it has to be ensured that the last-incoming conductor plate 11 which is to be added to the stack 1 of plates 11 lies true under the raised stack 1 of plates 11 before the stack 1 is lowered and placed on this conductor plate 11. For example, the stack 1 of plates 11 must not be lowered already at such time as the last-incoming tested conductor plate 11 is only half under this stack, its face not touching the locking slide 7. In order to ensure that the stacking process is carried out not before the last-pulsated conductor plate 11 is located completely under the stack 1, a stop switch 80 (FIG. 6) can be provided on the locking slide 7 or close thereto. If the conductor plate 11 which is to be added to the stack 1 of plates 11 has the correct position, the stop switch 80 is actuated by the plate 11. This stop switch 80 is connected to a further input 81 of the NOR circuit 30. If this stop switch 80 is not actuated by a conductor plate 11, a signal is applied to the corresponding input of the NOR circuit 30 by way of this stop switch 80. This leads in this case to no signal being applied to the output 76 of the NOR circuit 30, the stacking device hence not being actuated. If, on the other hand, the last-incoming conductor plate 11 has the correct position, the stop switch 80 is actuated, and the signal flow to the corresponding input 76 of the NOR circuit 30 is interrupted. Since the plate 11 is faultless, no signal is applied to the other inputs of the NOR circuit 30 either. In this case, the output 76 of the NOR circuit 30 shows a signal which puts the stacking device into operation.

In order that the apparatus may be adjusted to a given shape of conductor plates to be tested, the side walls 5 and thereby the gripper devices 4 are secured to respective adjusting bars 61 which in turn are movably supported by a pair of guide rods 62. The guide rods 62 are horizontal and extend transversely to the direction of feed of the conductor plates. In this manner, it is possible to adjust the apparatus to any desired width of conductor plates.

In a further embodiment of the apparatus in accordance with the invention and indicated in FIG. 5 and in broken lines in FIG. 1, a lock slide 7 is located at the forward end (at the left end in FIG. 1) of the stacking device. This locking slide 7 is lowered when it is in its locking position, so that a conductor plate which runs underneath the raised stack 1 is stopped by said locking slide 7. Thus the locking slide 7 is lowered when the entering conductor plate has been approved by the tester. If, for example, an insulation defect has been determined in an entering conductor plate, then the locking slide is raised to an open position, so that the conductor plate is not stopped but passed through underneath the raised stack 1 and is thus not added to the stack of approved plates. In addition to the flaps 33, this locking slide 7 thus offers a further aid in sorting out defective conductor plates.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. Apparatus for sorting and stacking tested conductor plates comprising:
   stacking means for forming from the bottom up a stack of conductor plates which have passed the tests, said stacking means including a pair of side walls and a pair of gripping means disposed opposite each other for gripping and for lifting and lowering the stacked conductor plates relative to a support plane,
   each said gripping means having an angle member which is laterally movable and moving means secured to said angle member for moving it vertically toward and away from the support plane and for moving it laterally parallel to the support plane,
   lifting means for raising from the bottom the entire stack each time a tested conductor plate approaches the bottom of said stack,
   plate feeding means for feeding each tested conductor plate beneath said raised stack,
   temporary support means to which the latest tested plate is fed by said plate feeding means, comprising a series of parallel spaced-apart rods and said angle members comprise a comb-like horizontal member with tines aligned to the spaces between the rods of the temporary support means,
   ejecting means for actuating said temporary support means to eject a failed said plate,
   lowering means for lowering said stack after an ejection opportunity has passed, and
   stack unifying means for lowering said lifting means below a latest-tested plate that has passed the test, so that such a plate is incorporated into the stack before said lifting means is next activated.

2. Apparatus in accordance with claim 1, wherein flap arms are provided, to which the rods of the temporary support means is secured, said flap arms being tiltable downwardly on horizontal axes.

3. Apparatus for sorting and stacking tested conductor plates comprising:
   stacking means for forming from the bottom up a stack of conductor plates which have passed the tests, said stacking means including
   a pair of side walls and a pair of gripping means disposed opposite each other for gripping and for lifting and lowering the stacked conductor plates relative to a support plane,
   each said gripping means having an angle member which is laterally movable and moving means secured to said angle member for moving it vertically toward and away from the support plane and for moving it laterally parallel to the support plane,
   lifting means for raising from the bottom the entire stack each time a tested conductor plate approaches the bottom of said stack,
   plate feeding means for feeding each tested conductor plate beneath said raised stack,
   temporary support means to which the latest tested plate is fed by said plate feeding means, each side wall being provided with a stop mounted movably parallel to the plane of the temporary support means, ejecting means for actuating said temporary support means to eject a failed said plate, lowering means for lowering said stack after an ejection opportunity has passed, and stack unifying means for lowering said lifting means below a latest-tested plate that has passed the test, so that such a plate is incorporated into the stack before said lifting means is next activated.

* * * * *